(12) United States Patent
Jung et al.

(10) Patent No.: US 6,749,990 B2
(45) Date of Patent: Jun. 15, 2004

(54) CHEMICAL AMPLIFICATION PHOTORESIST MONOMERS, POLYMERS THEREFROM AND PHOTORESIST COMPOSITIONS CONTAINING THE SAME

(75) Inventors: Jae Chang Jung, Kyoungki-do (KR); Geun Su Lee, Kyoungki-do (KR); Ki Soo Shin, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 35 days.

(21) Appl. No.: 10/054,095

(22) Filed: Jan. 22, 2002

(65) Prior Publication Data

US 2003/0017404 A1 Jan. 23, 2003

(30) Foreign Application Priority Data

Jun. 29, 2001 (KR) .................................... 2001-0038030

(51) Int. Cl.$^7$ ........................ G03F 7/004; C08F 214/18; C08F 126/06
(52) U.S. Cl. .................... 430/270.1; 430/326; 430/907; 526/250; 526/253; 526/259; 526/262
(58) Field of Search .............................. 430/270.1, 326, 430/907; 526/250, 253, 259, 262

(56) References Cited

U.S. PATENT DOCUMENTS

| | | | | |
|---|---|---|---|---|
| 4,624,988 A | * | 11/1986 | Fritschel et al. | ............ 525/151 |
| 5,216,081 A | * | 6/1993 | Mohri et al. | ................ 525/199 |
| 6,045,968 A | * | 4/2000 | Ushirogouchi et al. | .. 430/270.1 |

2002/0061464 A1 * 5/2002 Aoai et al.

OTHER PUBLICATIONS

Aoai et al, US 2002/0061464 A1 May 2002.*

* cited by examiner

Primary Examiner—Rosemary Ashton
(74) Attorney, Agent, or Firm—Marshall, Gerstein & Borun LLP

(57) ABSTRACT

A chemical amplification photoresist monomer, a photoresist polymer prepared thereof, and a photoresist composition using the polymer. More specifically, a chemical amplification photoresist polymer comprising a fluorine-containing monomer represented by Chemical Formula 1, and a composition comprising the polymer.

The photoresist composition has excellent etching resistance, heat resistance and adhesiveness, and is developable in aqueous tetramethylammonium hydroxide (TMAH) solution. As the composition has low light absorbance at 193 nm and 157 nm wavelength, it is very useful for forming ultramicro pattern in the process using a light source of far ultraviolet, especially of VUV (157 nm).

Chemical Formula 1

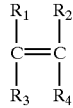

In the Formula, $R_1$, $R_2$, $R_3$ and $R_4$ is defined in the specification.

24 Claims, 1 Drawing Sheet

CHEMICAL AMPLIFICATION PHOTORESIST MONOMERS, POLYMERS THEREFROM AND PHOTORESIST COMPOSITIONS CONTAINING THE SAME

TECHNICAL FIELD

Novel photoresist monomers, polymers thereof, and photoresist compositions using the same are disclosed. In particular, chemical amplification photoresist polymers and photoresist compositions are disclosed which are suitable for a photolithography process using a light source such as VUV (157 nm) in fabricating a minute circuit for a highly integrated semiconductor device.

BACKGROUND

In general, a useful photoresist for ArF or VUV (vacuum ultraviolet) should have low absorbency at 193 nm and 157 nm wavelengths, excellent etching resistance and adhesiveness on the substrate, and should be able to be developed in a commercially available developing solution, such as 2.38 wt % and 2.6 wt % aqueous tetramethylammonium hydroxide (hereinafter abbreviated to as "TMAH") solution.

Recently, much research has been conducted on resins having a high transparency at a wavelength of 248 nm and 193 nm and dry etching resistance similar to novolac resin. However, most of these photoresists cannot be deposited in a sufficient thickness to render a suitable dry etching resistance. Also, these recently developed resins have poor transmittance at 157 nm wavelength.

A photoresist for 157 nm should have excellent etching resistance, heating resistance and adhesiveness on the substrate, and should be able to be developed in 2.38 wt % aqueous TMAH solution as a conventional developing solution. However, it is very difficult to synthesize such a polymer that satisfies all these requirements.

For use of a light source of a short wavelength (157 nm), photosensitive agents are available with transparency for the light source of 157 nm, but the available organic photoresist polymers absorb light having a wavelength of 157 nm.

Thus, the primary problem to be solved first when forming a micro pattern of 100 nm or less by using extremely short wavelength (157 nm) is to develop a photoresist polymer which has excellent etching resistance, heat resistance, adhesive property and good transmittance at 157 nm wavelength, and which can be developed in conventional 2.38 wt % aqueous TMAH developing solution.

Therefore, there is a need for a photoresist composition that overcomes the above-mentioned disadvantages.

SUMMARY OF THE DISCLOSURE

Chemical amplification photoresist monomers containing imide and fluorine which has appropriate transmittance of a light source of 157 nm in a photolithography process are disclosed.

Photoresist polymers containing the above photoresist monomers and which has appropriate transmittance of a light source of 157 nm in a photolithography process are also disclosed.

Photoresist compositions containing the photoresist polymers described above and a process for forming a photoresist pattern using the photoresist composition are also disclosed.

Semiconductor elements produced using the photoresist composition described above are also disclosed.

DETAILED DESCRIPTION OF THE PRESENTLY PREFERRED EMBODIMENTS

Figure 1:
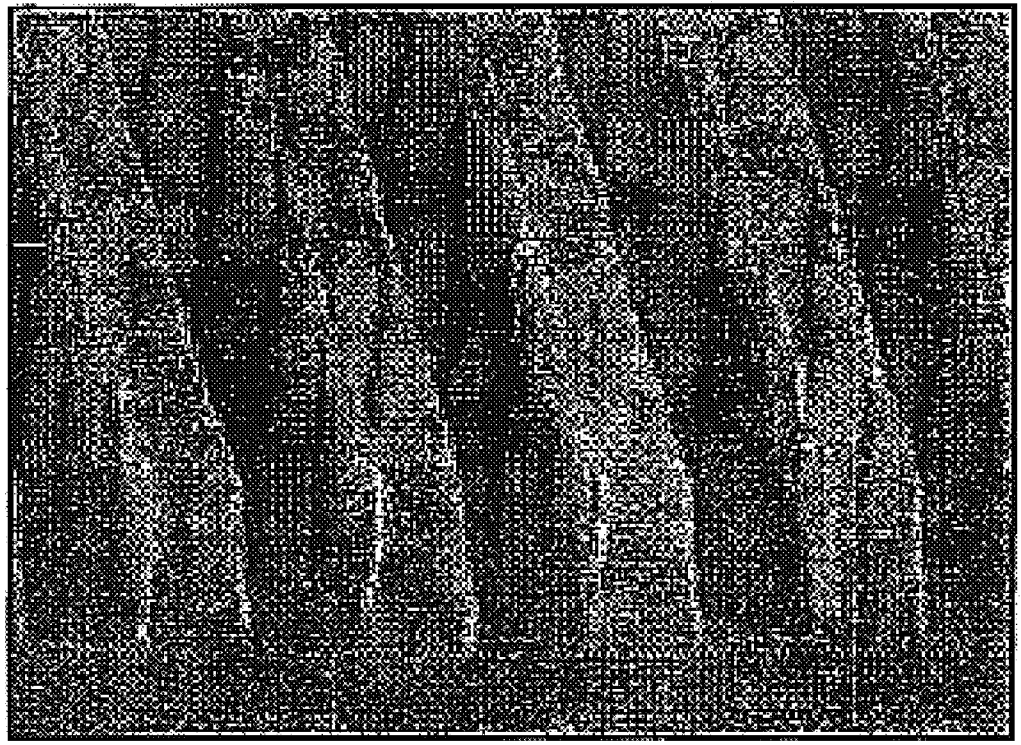
FIG. 1 is a photograph showing a pattern obtained in Example 4.

A chemical amplification photoresist monomer is disclosed that contains a halogen structure, that is represented by following Chemical Formula 1, and that is characterized by a strong etching resistance.

Chemical Formula 1

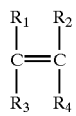

wherein, $R_1$, $R_2$, $R_3$ and $R_4$ individually represent a hydrogen or a halogen-substituted alkyl; and wherein that at least one of $R_1$, $R_2$, $R_3$ and $R_4$ is a halogen-substituted alkyl.

The monomer can be preferably represented by following Chemical Formula 2:

Chemical Formula 2

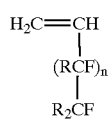

wherein, R is H or F; and n is an integer from 1 to 5.

As a preferable example of the monomer represented by Chemical Formula 2 is 3,3,4,4,5,5,6,6,6-nonafluoro-1-hexene.

A photoresist copolymer can comprise the monomer represented by Chemical Formula 1.

The copolymer may further comprise the compound represented by following Chemical Formula 3, which has a function of inhibiting dissolution.

Chemical Formula 3

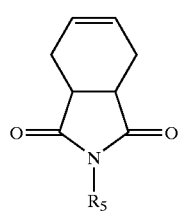

wherein, $R_5$ is COOR'; and R' is an acid labile protecting group.

The acid labile protecting group is the one that can be released by acid, which prevent the compound from dissolving in an alkaline developing solution. Some of conventional acid labile protecting group is bounded to polymer, the dissolution of photoresist material by alkaline developing solution is inhibited, while, if the acid labile protecting group is released by acid generated by light exposure, the photoresist material can be dissolved in developing solution. As the acid labile protective group, any groups that can serve such a role may be used; the groups include what are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferred acid labile protecting groups are selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl and 2-acetylmenth-1-yl.

Preferably, the compound of Chemical Formula 3 includes N-(alkyloxycarbonyl)cis-4-cyclohexene-1,2-dicarboxylic imide, especially, N-(tert-butyloxycarbonyl) cis-4-cyclohexene-1,2-dicarboxylic imide of following Chemical Formula 3a.

Chemical Formula 3a

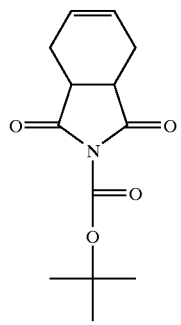

In addition, the copolymer according to the present invention contains the cis-4-cyclohexene-1,2-dicarboxyimide of following Chemical Formula 4.

Chemical Formula 4

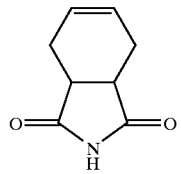

A preferred photoresist copolymer has repeating unit represented by following Chemical Formula 5. The polymerization repeating unit of Chemical Formula 5 has high etching resistance due to the cyclic ring back bone, and the monomer component contains fluorine, to provide excellent transmittance and etching resistance for VUV (157 nm).

Chemical Formula 5

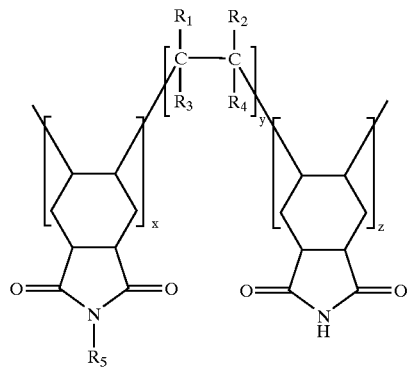

wherein, $R_1$, $R_2$, $R_3$ and $R_4$ individually represent a hydrogen or a halogen-substituted alkyl; and wherein at least one of $R_1$, $R_2$, $R_3$ and $R_4$ is a halogen-substituted alkyl; $R_5$ is COOR'; R' is an acid labile protecting group; the mol % ratio x:y:z falls within the ranges 0 to about 40 mol %:20 to about 40 mol %:0 to about 50 mol %; preferably, 20 to about 40 mol %:20 to about 40 mol %:20 to about 50 mol %; and more preferably, about 30 mol %:about 30 mol %:about 40 mol %.

Preferable example of the polymerization repeating unit can be represented by the following Chemical Formula 6:

Chemical Formula 6

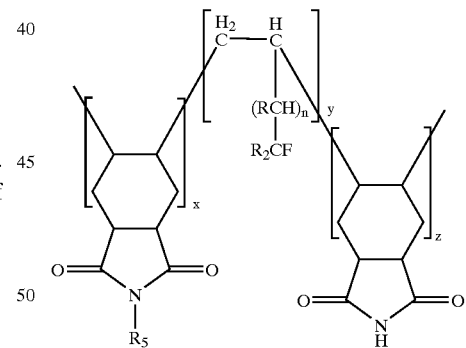

wherein, R is H or F; $R_5$ is COOR'; R' is an acid labile protecting group; n is an integer from 1 to 5; the mol % ratio x:y:z falls within the ranges 0 to about 40 mol %:20 to about 40 mol %:0 to about 50 mol %; preferably, 20 to about 40 mol %:20 to about 40 mol %:20 to about 50 mol %; and more preferably, about 30 mol %:about 30 mol %:about 40 mol %.

In addition, the photoresist composition comprising the repeating unit of Chemical Formula 6 exhibits low absorbance at 157 nm wavelength range, and excellent etching property.

The disclosed polymers can be prepared by various methods.

In one particularly preferred method, polymers are prepared by the process including the steps of:
(a) admixing (i) compound of Chemical Formula 1, optionally (ii) at least of the compounds of Chemical Formula 3 and Chemical Formula 4; and
(b) adding a radical polymerization initiator or metal catalyst into the resultant to perform a polymerization.

The polymerization processes include the processes disclosed by U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,225,020 B1 (May 1, 2001), U.S. Pat. No. 6,235,448 B1 (May 22, 2001) and U.S. Pat. No. 6,235, 447 B1 (May 22, 2001). The step (a) is preferably carried out in a conventional organic solvent, for example, tetrahydrofuran, chlorobenzene, cyclohexanone, cyclopentanone, dimethylformamide, dimethylsulfoxide, dioxane, benzene, toluene, xylene, propylene glycol methyl ether acetate and mixtures thereof.

The polymerization initiators can be any conventional one, preferably radical polymerization initiator, for example, 2,2'-azobisisobutylronitrile(AIBN), benzoylperoxide, acetylperoxide, laurylperoxide or tert-butylperoxide.

In case of using metal catalyst, single or mixed catalyst selected from the group consisting of palladium ethylhexanoate, palladium (II) bis(trifluoroacetate), palladium (II) bis(acetylacetonate), palladium (II) 2-ethylhexanoate, palladium (II) bromide, palladium (II) chloride, palladium (II) iodide, monoacetonitriletris (triphenylphosphine)palladium (II) tetrafluoroborate, tetrakis(acetonitrile)palladium (II) tetrafluoroborate, dichlorobis(acetonitrile)palladium (II), dichlorobis (triphenylphosphine)palladium (II), dichloro(benzonitrile) palladium (II), palladium acetylacetonate, palladium bis (acetonitrile)dichloride, palladium bis(dimethylsulfoxide) dichloride, nickel ethylhexanoate, nickel carboxylate, nickel diketylglyoxime, nickel ethylacetyl hexanoate and bis(allyl) nickel, is preferably used.

More preferably, after polymerization the polymer is subject to crystallization and/or purification by using a suitable solvent, for example, diethyl ether, petroleum ether, hexane, alcohols (methanol, ethanol, isopropanol, or the like), water, or mixtures thereof.

In addition, the present invention provides a photoresist composition containing (i) a photoresist polymer described above; (ii) a photoacid generator; and (iii) an organic solvent.

As of photoacid generator, which is able to generate acid when it is exposed to light, and as organic solvent, conventional ones may be employed. The processes for preparing the composition include what is disclosed by U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132, 926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001).

Preferred photoacid generators include sulfide or onium type compound. Specifically, photoacid generator is selected from the group consisting of phthalimidotrifluoromethanesulfonate, dinitrobenzyl tosylate, n-decyldisulfone and naphthylimidotrifluoromethanesulfonate, which has relatively low absorbance at 157 nm and 193 nm. Together with the compounds, a photoacid generator selected from the group consisting of diphenyliodide hexafluorophosphate, diphenyliodide hexafluoroarsenate, diphenyliodide hexafluoroantimonate, diphenyl-p-methoxyphenyl triflate, diphenyl-p-toluenyl triflate, diphenyl-p-isobutylphenyl triflate,
triphenylsulfonium hexafluoroarsenate, triphenylsulfonium hexafluoroantimonate, triphenylsulfonium triflate and dibutylnaphthylsulfonium triflate may be used.

The photoacid generator is preferably used in an amount of 0.05 to 10 wt % of the photoresist polymer. If the amount is less than 0.05 wt %, sensitivity of the photoresist to light becomes insufficient, while if it is more than 10 wt %, the photoacid generator largely absorbs far ultraviolet to generate too much acid to deteriorate the cross section of the pattern.

As the organic solvent, any organic solvent conventionally used for the photoresist composition can be used; single or mixed solvent of diethyleneglycol diethyl ether, ethyl 3-ethoxypropionate, methyl 3-methoxy propionate, cyclohexanone, propyleneglycol methyl ether acetate, n-heptanone, ethyl lactate or cyclopentanone is preferably used.

The amount of solvent used is preferably in the range of from about 500 to 2000 wt % of the photoresist polymer. This ratio has been found to be particularly useful for obtaining a photoresist layer of a desirable thickness when coated on to a substrate.

In addition the present invention provides a process for forming a photoresist pattern, comprise the steps of:
(a) coating the photoresist composition described above on a substrate to form a photoresist film;
(b) exposing the photoresist film to light; and
(c) developing the photoresist film.

The process for forming the photoresist pattern can further include a soft baking step which is performed before the step (b) and/or a post baking step which is performed after the step (b). Preferably, the soft and post baking steps are performed at the temperature of from about 70 to about 200° C.

Exemplary light source which are useful for forming the photoresist pattern include KrF, ArF, E-beam, VUV, EUV or ion beam. Preferably, the irradiation energy is in the step (b) is in the range of between about 1 mJ/cm$^2$ and about 100 mJ/cm$^2$.

The disclosed monomers, polymers and photoresist compositions will now be described in more detail by referring to the examples below, which are not intended to be limiting.
I. Preparation of Catalyst Solution

EXAMPLE 1

Preparation of Catalyst Solution

Under nitrogen atmosphere, allylpalladium chloride dimmer (allyl$_3$PdCl$_2$)$_2$ (176.4 mg) and silver hexafluoroantimonate (AgSbF$_6$) (510 mg) were added to 30 ml of chlorobenzene, and the mixture was heated under reflux for about 30 minutes to prepare the catalyst solution.

II. Preparation of Photoresist Polymer

EXAMPLE 2

Synthesis of poly(N-(tert-butyloxycarbonyl)cis-4-cyclohexene-1,2-dicarboxylic Imide/3,3,4,4,5,5,6,6,6-nonafluoro-1-hexene/cis-4-cyclohexene-1,2-dicarboxyimide N-(tert-butyloxycarbonyl)cis-4-cyclohexene-1,2-dicarboxylic imide (1.5 g) of Chemical Formula 3a, 3,3,4,4,5,5,6,6,6-nonafluoro-1-hexene (2 g) and cis-4-cyclohexene-1,2-dicarboxyimide (1.5 g) were dissolved in 45 ml of chlorobenzene, and the mixture was heated under reflux for 30 minutes. After heating under reflux, the catalyst solution obtained from Example 1 after it was passed through a syringe filter of 0.4 μm to remove impurities, was added to the reaction mixture, and the resultant mixture was reacted at room temperature for 48 hours. After the reaction was completed, polymer precipitate was taken from ethyl ether and dried in vacuo to obtain title compound (yield: 51%).

Weight average molecular weight of the polymer was 15,000, and polydispersibility (weight average molecular weight/number average molecular weight) was 1.6.

III. Preparation of Photoresist Composition and Pattern Formation

EXAMPLE 3

Transmittance Against 157 nm

The photoresist polymer (1 g) prepared from Example 2 was dissolved in cyclohexanone (10 ml), and transmittance against 157 nm was measured. At the film thickness of 0.2 μm, optical density was 0.6, and it was useful for a photosensitive agent at 157 nm.

EXAMPLE 4

Preparation of Photoresist Composition and Formation of Micro Pattern

Photoresist polymer prepared from Example 2 (1 g) and triphenylsulfoniumtriflate (0.02 g) as photoacid generator were dissolved in 10 ml of cyclohexanone, and the solution was heated under reflux for 2 hours to prepare photoresist composition.

The photoresist composition was coated on a silicon wafer that had been treated with hexamethyldisilazane (HMDS), and baked at 130° C. for 90 seconds. After baking, it was light exposed by using a light exposing device employing light source for 193 nm wavelength, and baked again at 130° C. for 90 seconds. Then, the composition was developed in 2.38 wt % TMAH solution for 90 seconds to give 0.15 μm L/S pattern (see FIG. 1).

As seen from Example 3, the photoresist polymer according to the present invention has excellent transmittance at 157 nm wavelength, so that it can be useful for photolithography process using a light source of 157 nm. Further, it is found, from Example 4, that the photoresist composition according to the present invention can be adopted to conventional lithography process.

A chemical amplification photoresist polymer containing imide and fluorine and a photoresist composition comprising the polymer can be employed in lithography process using VUV (157 nm) light source.

What is claimed:

1. A photoresist polymer comprising:

a first repeating unit represented by the following Chemical Formula 1:

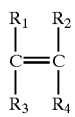

Chemical Formula 1 wherein $R_1$, $R_2$, $R_3$ and $R_4$ individually are a hydrogen or a halogen-substituted alkyl; and wherein at least one of $R_1$, $R_2$, $R_3$ and $R_4$ is a halogen-substituted alkyl; and a second repeating unit represented by the following Chemical Formula 3:

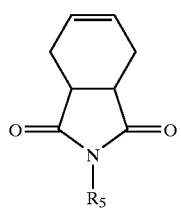

Chemical Formula 3 wherein $R_5$ is COOR' and R' is an acid labile protecting group.

2. A photoresist polymer according to claim 1, wherein the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl and 2-acetylmenth-1-yl.

3. A photoresist polymer according to claim 1, wherein the second repeating unit of Chemical Formula 3 is the compound represented by the following Chemical Formula 3a:

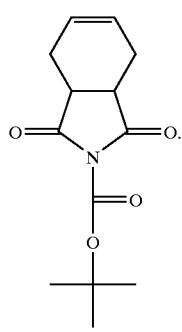

Chemical Formula 3a

4. A photoresist polymer according to claim 1, which further comprises the compound represented by the following Chemical Formula 4:

Chemical Formula 4

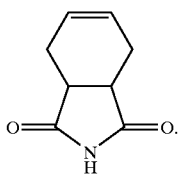

5. A photoresist polymer comprising a repeating unit represented by the Chemical Formula 5:

Chemical Formula 5

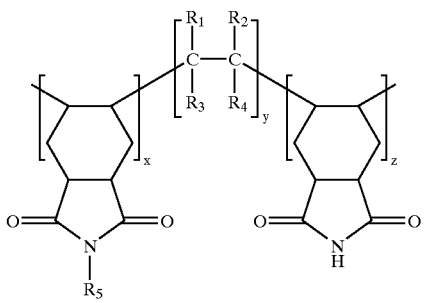

wherein, $R_1$, $R_2$, $R_3$ and $R_4$ individually are a hydrogen or a halogen-substituted alkyl; and wherein at least one of $R_1$, $R_2$, $R_3$ and $R_4$ is a halogen-substituted alkyl; $R_5$ is COOR'; R' is an acid labile protecting group; and the mol % ratio x:y:z falls within the following ranges: 0 to about 40 mol %:20 to about 40 mol %:0 to about 50 mol %.

6. A photoresist polymer according to claim 5, wherein the polymerization repeating unit of the Chemical Formula 5 is represented by the following Chemical Formula 6:

Chemical Formula 6

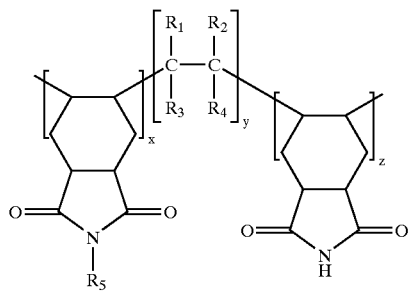

wherein, R is H or F; $R_5$ is COOR'; R' is an acid labile protecting group; n is an integer from 1 to 5; and the mol % ratio x:y:z falls within the following ranges: 0 to about 40 mol %:20 to about 40 mol %:0 to about 50 mol %.

7. A process for preparing a repeating unit of a photoresist polymer of claim 5, comprising:
(a) admixing (i) the compound of Chemical Formula 1, and (ii) at least one of the compound of following Chemical Formula 3 and Chemical Formula 4; and
(b) adding a polymerization initiator and a metal catalyst into the resultant to perform a polymerization initiator, thereby obtaining the repeating unit of Chemical Formula 5:

Chemical Formula 1

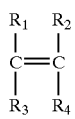

Chemical Formula 3

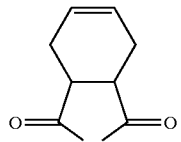

Chemical Formula 4

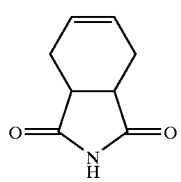

Chemical Formula 5

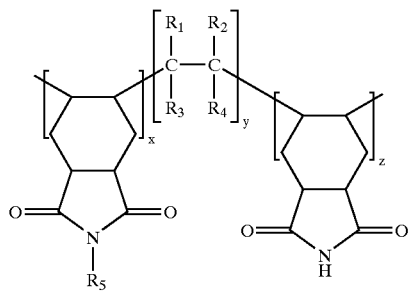

wherein, $R_1$, $R_2$, $R_3$ and $R_4$ are individually a hydrogen or a halogen-substituted alkyl; wherein at least one of $R_1$, $R_2$, $R_3$ and $R_4$ is a halogen-substituted alkyl; $R_5$ is COOR'; R' is an acid labile protecting group; and x, y and z are polymerization ratios.

8. The process according to claim 7, wherein the mol % ratio x:y:z of Chemical Formula 5 falls within the following ranges: 0 to about 40 mol %:20 to about 40 mol %:0 to about 50 mol %.

9. The process according to claim 7, wherein the mol % ratio x:y:z of Chemical Formula 5 falls within the following ranges: 20 to about 40 mol %:20 to about 40 mol %:20 to about 50 mol %.

10. The process according to claim 7, wherein the step (a) is carried out in a polymerization solvent selected from the group consisting of tetrahydrofuran, dimethylformamide, dimethylsulfoxide, dioxane, benzene, toluene, xylene, propylene glycol methyl ether acetate and mixtures thereof.

11. The process according to claim 7, wherein the metal catalyst is allylpalladium chloride dimmer [(allyl$_3$PdCl$_2$)$_2$] as an organometallic catalyst.

12. The process according to claim 7, wherein the metal catalyst is silver hexafluoroantimonate (AgSbF$_6$) as an inorganic metal catalyst.

13. The process according to claim 7, wherein the metal catalyst is single or mixed catalyst selected from the group consisting of palladium ethylhexanoate, palladium (II) bis(trifluoroacetate), palladium (II) bis(acetylacetonate), palladium (II) 2-ethylhexanoate, palladium (II) bromide, palladium (II) chloride, palladium (II) iodide, monoacetonitriletris(triphenylphosphine)palladium (II) tetrafluoroborate, tetrakis(acetonitrile)palladium (U)

tetrafluoroborate, dichlorobis(acetonitrile)palladium (II), dichlorobis(triphenylphosphine)palladium (II), dichloro (benzonitrile)palladium (II), palladium acetylacetonate, palladium bis(acetonitrile)dichloride, palladium bis(dimethylsulfoxide)dichloride, nickel ethylhexanoate, nickel carboxylate, nickel diketyiglyoxime, nickel ethylacetyl hexanoate and bis(allyl)nickel.

14. A photoresist composition comprising (i) a photoresist polymer of claim 1; (ii) a photoacid generator; and (iii) an organic solvent.

15. The photoresist composition according to claim 14, wherein the photoacid generator is selected from the group consisting of phthalimidotrifluoromethane sulfonate, dinitrobenzyl tosylate, n-decyl disulfone and naphthyl imido trifluoromethanesulfonate.

16. The photoresist composition according to claim 14, wherein the photoacid generator further comprises one or more compound(s) selected from the group consisting of diphenyl iodide hexafluorophosphate, diphenyliodide hexafluoroarsenate, diphenyliodide hexafluoroantimonate, diphenyl-p-methoxyphenyl triflate, diphenyl-p-toluenyl triflate, diphenyl-p-isobutylphenyl triflate, triphenylsulfonium hexafluoroarsenate, triphenylsulfonium hexafluoroantimonate, triphenylsulfonium triflate and dibutylnaphthylsulfonium triflate.

17. The photoresist composition according to claim 14, wherein the photoacid generator is used in an amount ranging from about 0.05 to about 10% by weight of the photoresist polymer.

18. The photoresist composition according to claim 14, wherein the organic solvent is selected from the group consisting of diethyleneglycol diethyl ether, ethyl 3-ethoxypropionate, methyl-3-methoxypropionate, cyclohexanone, propyleneglycol methyl ether acetate, n-heptanone, ethyl lactate, cyclopentanone and mixtures thereof.

19. The photoresist composition according to claim 14, wherein the organic solvent is used in an amount ranging from about 500 to about 2000% by weight of said photoresist polymer.

20. A process for formation of a photoresist pattern, comprising:

(a) coating the photoresist composition of claim 14 on a substrate to form a photoresist film;

(b) exposing the photoresist film to light; and (c) developing the photoresist film.

21. The process according to claim 20, further comprising a soft baking step before step (b) and/or a post baking step after step (b).

22. The process according to claim 21, wherein the soft and post baking steps are performed at the temperature ranging from about 70 to about 200° C.

23. The process according to claim 20, wherein the source of light is selected from the group consisting of KrF, ArF, E-beam, VUV, EUV and ion beam.

24. A semiconductor element manufactured according to the process of claim 20.

* * * * *

UNITED STATES PATENT AND TRADEMARK OFFICE
CERTIFICATE OF CORRECTION

PATENT NO.    : 6,749,990 B2
DATED         : June 15, 2004
INVENTOR(S)   : Jae Chang Jung et al.

It is certified that error appears in the above-identified patent and that said Letters Patent is hereby corrected as shown below:

Column 10,
Line 67, please delete "(U)" and replace with -- (II) --.

Column 11,
Line 6, please delete "diketyiglyoxime" and replace with -- diketylglyoxime --.
Lines 6 and 7, please delete "ethy-lacetyl hexanoate" and replace with
-- ethylacetylhexanoate --.

Signed and Sealed this

First Day of February, 2005

JON W. DUDAS
*Director of the United States Patent and Trademark Office*